United States Patent
Piel et al.

(10) Patent No.: US 10,785,833 B2
(45) Date of Patent: Sep. 22, 2020

(54) INTEGRATED SOLID STATE MICROWAVE POWER GENERATION MODULES

(71) Applicants: Pierre-Marie J. Piel, Chandler, AZ (US); David P. Lester, Phoenix, AZ (US); Lionel Mongin, Chandler, AZ (US)

(72) Inventors: Pierre-Marie J. Piel, Chandler, AZ (US); David P. Lester, Phoenix, AZ (US); Lionel Mongin, Chandler, AZ (US)

(73) Assignee: NSP USA, Inc., Austin, TX (US)

( * ) Notice: Subject to any disclaimer, the term of this patent is extended or adjusted under 35 U.S.C. 154(b) by 605 days.

(21) Appl. No.: 14/912,124

(22) PCT Filed: Aug. 29, 2013

(86) PCT No.: PCT/IB2013/002218
§ 371 (c)(1),
(2) Date: Feb. 15, 2016

(87) PCT Pub. No.: WO2015/028839
PCT Pub. Date: Mar. 5, 2015

(65) Prior Publication Data
US 2016/0198530 A1 Jul. 7, 2016

(51) Int. Cl.
*H05B 6/66* (2006.01)
*H05B 6/68* (2006.01)
*H05B 6/64* (2006.01)

(52) U.S. Cl.
CPC ............. *H05B 6/664* (2013.01); *H05B 6/645* (2013.01); *H05B 6/686* (2013.01); *Y02B 40/143* (2013.01)

(58) Field of Classification Search
CPC .......................... H03B 1/02; H03B 2200/0076; H03B 5/1847; H05B 6/66; H05K 3/303; Y10T 29/49155
See application file for complete search history.

(56) References Cited

U.S. PATENT DOCUMENTS

| | | | |
|---|---|---|---|
| 3,557,333 A | 1/1971 | McAvoy | |
| 3,691,338 A * | 9/1972 | Chang | H05B 6/80 219/697 |

(Continued)

FOREIGN PATENT DOCUMENTS

| | | |
|---|---|---|
| CN | 1401155 A | 3/2003 |
| CN | 1764332 A | 4/2006 |

(Continued)

OTHER PUBLICATIONS

International Search Report for International Application No. PCT/IB2013/002218 dated May 27, 2014.

*Primary Examiner* — Tu B Hoang
*Assistant Examiner* — Vy T Nguyen
(74) *Attorney, Agent, or Firm* — Sherry W. Schumm

(57) ABSTRACT

An embodiment of a microwave power generation module includes an amplifier arrangement, an impedance matching element, and a resonant element. The amplifier arrangement includes a transistor with a transistor input and a transistor output. The impedance matching element is formed from a planar conductive structure. The planar conductive structure has a proximal end and a distal end, and the proximal end is electrically coupled to the transistor output. The resonant element has a proximal end electrically coupled to the distal end of the planar conductive structure, and the resonant element is configured to radiate electromagnetic energy having a microwave frequency in a range of 800 megahertz (MHz) to 300 gigahertz (GHz). A combination of the impedance matching element and the resonant element is configured to perform an impedance transformation between an impedance of the transistor and an impedance of an air cavity.

11 Claims, 5 Drawing Sheets

(56) References Cited

U.S. PATENT DOCUMENTS

| | | | |
|---|---|---|---|
| 4,097,708 | A | 6/1978 | Bickel |
| 5,558,800 | A | 9/1996 | Page |
| 6,208,214 | B1 | 3/2001 | Geddes et al. |
| 6,331,815 | B1 | 12/2001 | Oshima et al. |
| 8,019,289 | B2 * | 9/2011 | Gorbachov ............. H04B 1/18 455/83 |
| 8,558,622 | B2 | 10/2013 | Uno et al. |
| 2007/0108195 | A1 | 5/2007 | Tian et al. |
| 2007/0247243 | A1 | 10/2007 | Naletov et al. |
| 2009/0295509 | A1 | 12/2009 | Master et al. |
| 2013/0052960 | A1 * | 2/2013 | Do ....................... H03F 1/3258 455/67.11 |
| 2013/0267943 | A1 * | 10/2013 | Hancock ............ A61B 18/1815 606/33 |
| 2013/0278345 | A1 * | 10/2013 | Shi ...................... H01R 24/542 331/74 |
| 2013/0306627 | A1 * | 11/2013 | Libman ............... H05B 6/6435 219/705 |
| 2014/0002188 | A1 * | 1/2014 | Chen ........................ H03F 3/19 330/250 |

FOREIGN PATENT DOCUMENTS

| | | |
|---|---|---|
| CN | 102474228 A | 5/2012 |
| EP | 1035647 A1 | 9/2000 |
| EP | 1 643 641 A2 | 4/2006 |
| JP | 11-31923 A | 2/1999 |
| JP | 11031923 A | 2/1999 |
| WO | 00/13315 A1 | 3/2000 |

\* cited by examiner

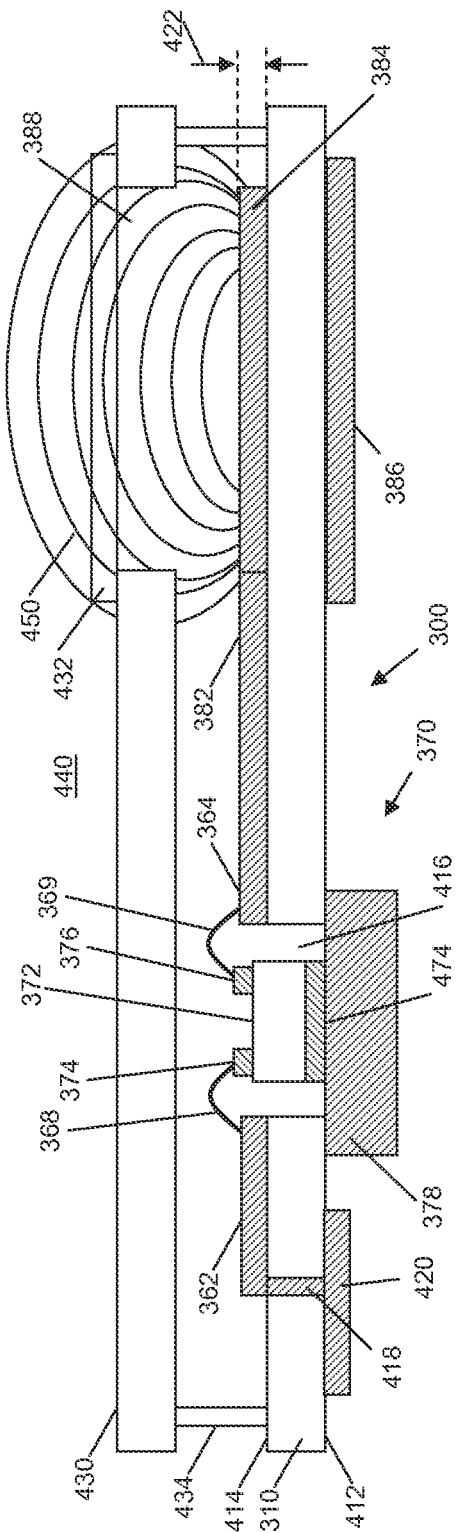
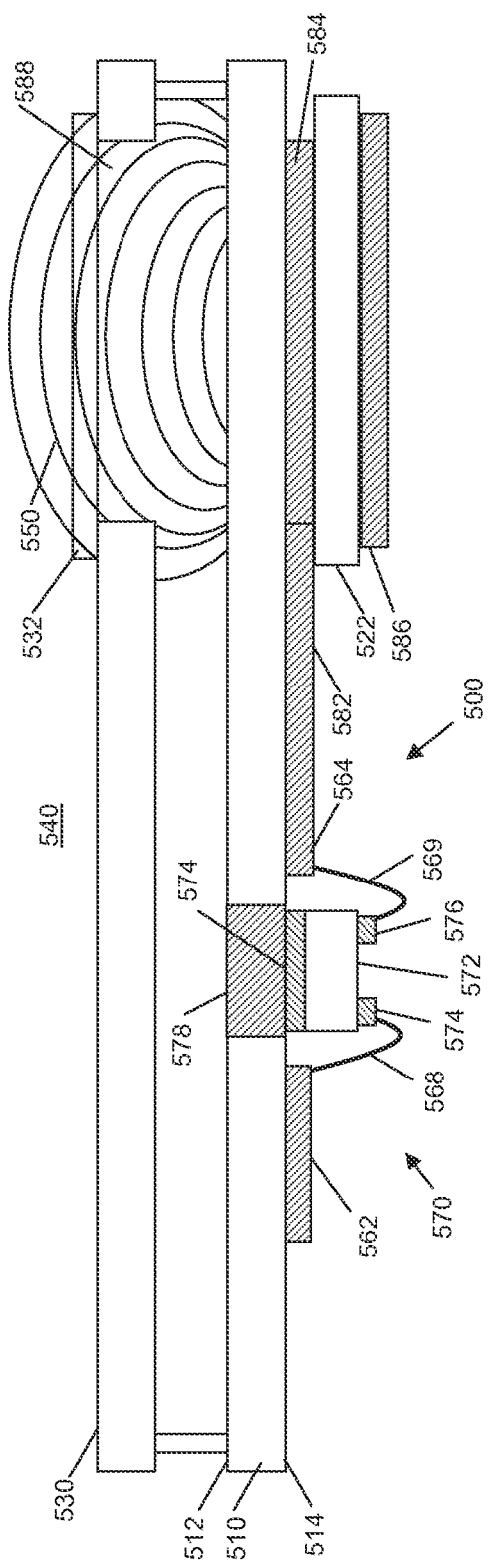
FIG. 4
FIG. 5

INTEGRATED SOLID STATE MICROWAVE POWER GENERATION MODULES

TECHNICAL FIELD

Embodiments of the subject matter described herein relate generally to electronic circuits, and more particularly, to solid state microwave power generation sub-systems for use in conjunction with microwave ovens and other systems.

BACKGROUND

For many years, magnetrons have been commonly used in microwave ovens to generate microwave energy for the purpose of heating food, beverages, or other items. Magnetrons may be used for other purposes, as well (e.g., for radar applications, wireless communication applications, and so on).

A magnetron essentially consists of a circular chamber with multiple cylindrical cavities spaced around its rim, a cathode built into the center of the chamber, and a magnet configured to generate a magnetic field. When incorporated into a microwave system, the cathode is coupled to a direct current (DC) power supply that is configured to provide a high voltage potential to the cathode. In a microwave oven, for example, the power supply may be required to provide 4 kilovolts or more to the cathode. The magnetic field and the cylindrical cavities cause electrons within the cavity to induce a resonant, high-frequency radio frequency (RF) field in the cavity, and a portion of the field may be extracted from the cavity via a probe. A waveguide coupled to the probe directs the RF energy to a load. For example, in a microwave oven, the load may be a heating chamber, the impedance of which may be affected by objects within the heating chamber.

Although magnetrons have functioned well in microwave and other applications, they are not without their disadvantages. For example, magnetrons typically require very high voltages to operate. In addition, magnetrons may be susceptible to output power degradation over extended periods of operation. Thus, the performance of systems in which magnetrons are included may degrade over time. Further, magnetrons tend to be bulky, heavy components that are sensitive to vibration, thus making their use in portable applications undesirable.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIG. 4 is a cross-sectional, side view of the integrated microwave power generation module of FIG. 3 along lines 4-4, in accordance with an example embodiment;

FIG. 5 is a cross-sectional, side view of an integrated microwave power generation module mounted to a chamber wall, in accordance with another example embodiment.

DETAILED DESCRIPTION

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the following detailed description.

Embodiments of the subject matter described herein relate to solid-state microwave power generation modules for use in microwave ovens and other types of systems. As described in greater detail below, exemplary microwave power generation modules are realized using an amplifier arrangement (including one or more transistors), an impedance matching element coupled to an output of the amplifier arrangement and formed from a planar conductive structure, and a resonant element coupled to the impedance matching element and configured to radiate electromagnetic energy having a wavelength in the microwave range. Together, the impedance matching element and the resonant element are configured to perform an impedance transformation between an impedance of the transistor(s) and an impedance of an air cavity (e.g., a heating chamber of a microwave oven).

Although the description herein discusses, in detail, the use of various embodiments of solid-state microwave power generation modules in microwave oven applications, it is to be understood that the various embodiments of solid-state microwave power generation modules may be used in other types of microwave systems, as well (e.g., radar systems, communication systems, and so on). Therefore, the applications described in detail herein are not meant to limit the applicability of the various embodiments only to microwave oven applications.

Figure 1:
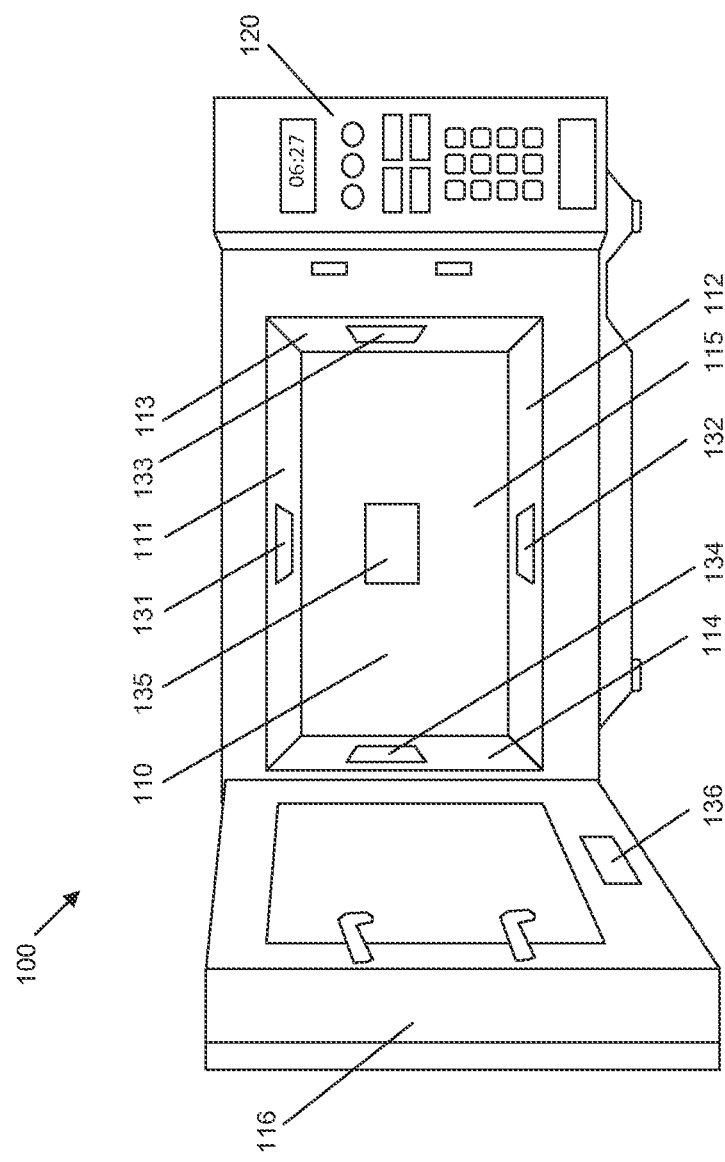
FIG. 1 is a perspective view of a microwave oven, in accordance with an example embodiment.

FIG. 1 is a perspective view of a microwave oven 100, in accordance with an example embodiment. Microwave oven 100 includes a heating chamber 110, a control panel 120, one or more microwave power generation modules 131, 132, 133, 134, 135, 136, a power supply (e.g., power supply 230, FIG. 2), and a system controller (e.g., system controller 210, FIG. 2). The heating chamber 110 is defined by interior surfaces of top, bottom, side, and back chamber walls 111, 112, 113, 114, 115 and an interior surface of door 116. With door 116 closed, the heating chamber 110 defines an enclosed air cavity. As used herein, the term "air cavity" may mean an enclosed area that contains air or other gasses (e.g., heating chamber 110) or an area of open space.

According to an embodiment, each of the microwave power generation modules 131-136136 is arranged proximate to a chamber wall 111-115 or to door 116. According to an embodiment, during operation of the microwave oven 100, a user (not illustrated) may place one or more objects (e.g., food and/or liquids) into the heating chamber 110, and may provide inputs via the control panel 120 that specify a desired heating duration and a desired power level. In response, a system controller (not illustrated) causes the microwave power generation modules 131-136136 to radiate electromagnetic energy in the microwave spectrum (referred to herein as "microwave energy") into the heating chamber 110. More specifically, the system controller causes the microwave power generation modules 131-136136 to radiate microwave energy into the heating chamber 110 for a period of time and at a power level that is consistent with the user inputs. The microwave energy increases the thermal energy of the object (i.e., the microwave energy causes the object to heat up).

In the embodiment illustrated in FIG. 1, a microwave power generation module 131-136136 is arranged proximate to each of the chamber walls 111-115 and to door 116. In alternate embodiments, fewer microwave power generation modules may be present in the system, including as few as one microwave power generation module proximate to a single chamber wall or to door 116. In other alternate embodiments, multiple microwave power generation modules may be proximate to any given chamber wall and/or to door 116.

In any event, microwave oven 100 includes at least one microwave power generation module 131-136 arranged proximate to at least one chamber wall 111-115 and/or to door 116. As used herein, the term "proximate to," when referring to the relative positioning of a microwave power generation module 131-136 with respect to a chamber wall 111-115 or to door 116, means that the microwave power generation module 131-136 may be attached to the interior surface of a chamber wall 111-115 or the door 116 (i.e., the microwave power generation module 131-136 is positioned within the heating chamber 110), or the microwave power generation module 131-136 may be attached to or positioned outside of an exterior surface of a chamber wall 111-115 or the door 116 (i.e., the microwave power generation module 131-136 is positioned outside of the heating chamber 110). In the latter embodiment, a resonant element (e.g., resonant element 284, FIG. 2) of the microwave power generation module 131-136 may be exposed to the heating chamber 110 through an aperture or opening in the chamber wall 111-115 or the door 116. In such an embodiment, the opening in the chamber wall 111-115 may be covered with a cover (e.g., a plate) that is configured to protect the resonant element (e.g., from food splatter) while not substantially blocking the microwave energy produced by the resonant element from entering the heating chamber 110. According to yet another embodiment, the microwave power generation module 131-136 may be attached to the chamber wall 111-115 or to the door 116 in a manner that the microwave power generation module 131-136 is flush with (i.e., substantially co-planar with) the chamber wall 111-115 or the door 116. In still other embodiments, portions of the microwave power generation module 131-136 (e.g., at least the resonant element) may be positioned within the heating chamber 110, and other portions of the microwave power generation module 131-136 may be positioned outside of the heating chamber.

Each microwave power generation module 131-136 is configured to produce and radiate microwave energy into the heating chamber 110. The radiated energy has a wavelength in the microwave spectrum that is particularly suitable for heating liquid and solid objects (e.g., liquids and food). For example, each microwave power generation module 131-136 may be configured to radiate microwave energy having a frequency in a range of about 2.0 gigahertz (GHz) to about 3.0 GHz into the heating chamber 110. More specifically, each microwave power generation module 131-136 may be configured to radiate microwave energy having a wavelength of about 2.45 GHz into the heating chamber 110, in an embodiment. Although each microwave power generation module 131-136 may radiate microwave energy of approximately the same wavelength, the microwave power generation modules 131-136 may radiate microwave energy of different wavelengths from each other, as well. Further, in embodiments of other systems (e.g., radar systems, communication systems, and so on) that include embodiments of microwave power generation modules, each microwave power generation module 131-136 may radiate microwave energy within a relatively wide bandwidth (e.g., a bandwidth anywhere within the microwave spectrum of about 800 megahertz (MHz) to about 300 GHz).

As will be described in further detail below, each microwave power generation module 131-136 may be implemented as an integrated "solid state" module, in that each microwave power generation module 131-136 includes a solid state circuit configuration to generate and radiate microwave energy rather than including a magnetron. Accordingly, embodiments of systems in which embodiments of microwave power generation modules are included may operate at relatively lower voltages, may be less susceptible to output power degradation over time, and/or may be relatively compact, when compared with conventional magnetron-based microwave systems.

Although microwave oven 100 is shown with its components in a particular relative orientation with respect to one another, it should be understood that the various components may be oriented differently, as well. In addition, the physical configurations of the various components may be different, as well. For example, control panel 120 may have more, fewer, or different user interface elements, and/or the user interface elements may be differently arranged. In addition, although a substantially cubic heating chamber 110 is illustrated in FIG. 1, it should be understood that a heating chamber may have a different shape, in other embodiments (e.g., cylindrical, and so on). Further, microwave oven 100 may include additional components (e.g., a fan, a stationary or rotating plate, a tray, an electrical cord, and so on) that are not specifically depicted in FIG. 1.

Figure 2:
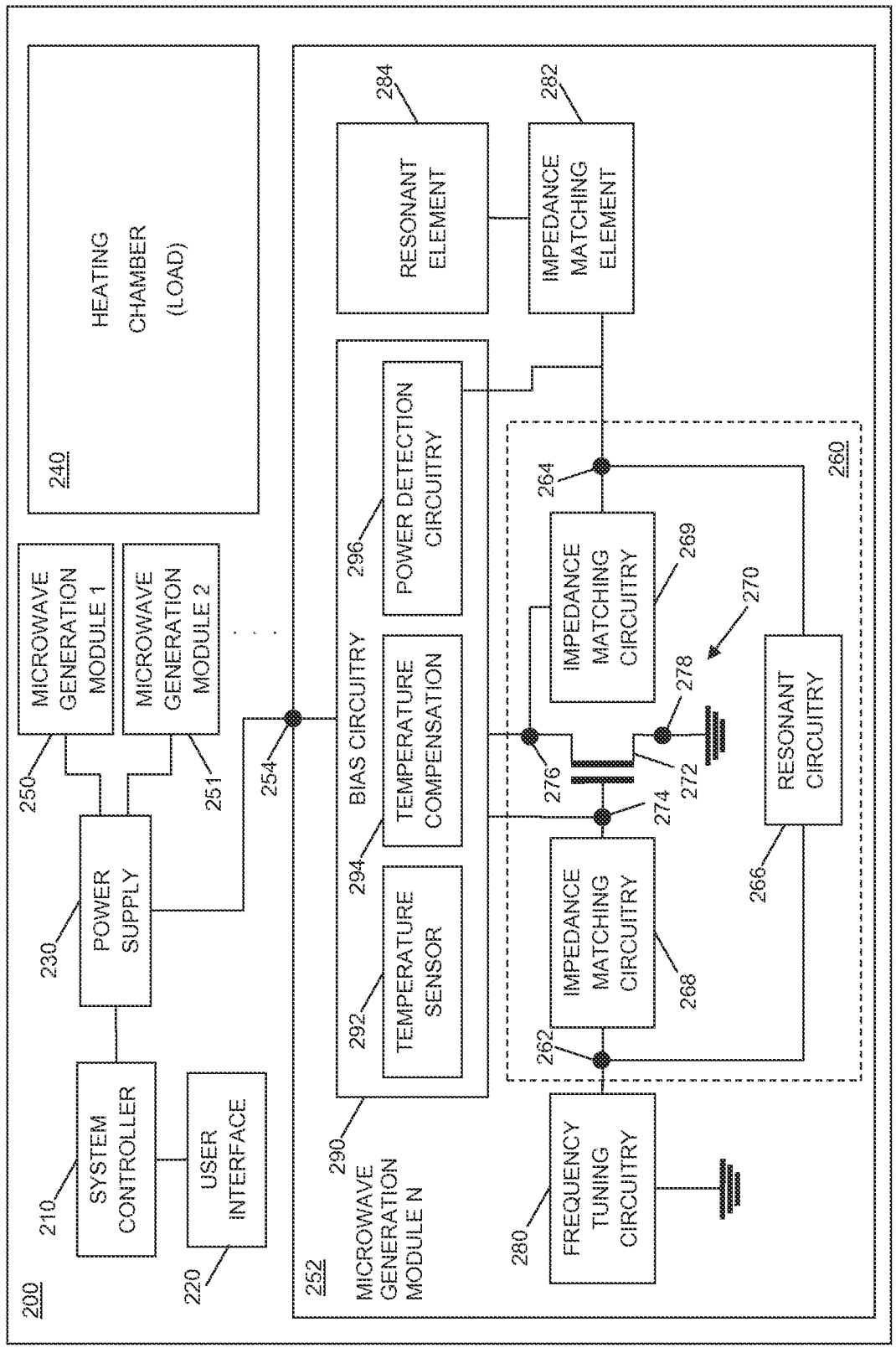
FIG. 2 is a simplified block diagram of a microwave system that includes an integrated microwave power generation module, in accordance with an example embodiment.

FIG. 2 is a simplified block diagram of a microwave system 200 (e.g., microwave oven 100, FIG. 1) that includes multiple microwave power generation modules 250, 251, 252, in accordance with an example embodiment. In various embodiments, microwave system 200 may include from 1 to N microwave power generation modules 250-252, where N can be any integer (e.g., an integer from 1 to 20). In addition, microwave system 200 includes system controller 210, user interface 220, power supply 230, and heating chamber 240. It should be understood that FIG. 2 is a simplified representation of a microwave system 200 for purposes of explanation and ease of description, and that practical embodiments may include other devices and components to provide additional functions and features, and/or the microwave system 200 may be part of a much larger electrical system.

User interface 220 may correspond to a control panel (e.g., control panel 120, FIG. 1), for example, which enables a user to provide inputs to the system regarding parameters for a heating operation (e.g., the duration of a heating operation, the power level for a heating operation, codes that correlate with particular heating operation parameters, and so on), start and cancel buttons, mechanical controls (e.g., a door open latch), and so on. In addition, the user interface may be configured to provide user-perceptible outputs indicating the status of a heating operation (e.g., a countdown timer, audible tones indicating completion of the heating operation, and so on) and other information.

System controller 210 is coupled to user interface 220 and to power supply 230. For example, system controller 210 may include a one or more general purpose or special purpose processors (e.g., a microprocessor, microcontroller, Application Specific Integrated Circuit (ASIC), and so on), volatile and/or non-volatile memory (e.g., Random Access Memory (RAM), Read Only Memory (ROM), flash, various registers, and so on), one or more communication busses, and other components. According to an embodiment, system controller 210 is configured to receive signals indicating user inputs received via user interface 220, and to cause power supply 230 to provide power to microwave power generation modules 250-252 for time durations and at power levels that correspond to the received user inputs.

Power supply 230 may selectively provide a supply voltage to each microwave power generation module 250-252 in accordance with control signals received from system controller 210. When supplied with an appropriate supply voltage from power supply 230, each microwave power generation module 250-252 will produce microwave energy, which is radiated into heating chamber 240. As mentioned previously, heating chamber 240 defines an air cavity. The air cavity and any objects (e.g., food, liquids, and so on) positioned in the heating chamber 240 correspond to a load for the microwave energy produced by the microwave power generation modules 250-252 The air cavity and the objects within the air cavity present an impedance to each microwave power generation module 250-252.

According to an embodiment, each microwave power generation module 250-252 includes an oscillator sub-system 260, frequency tuning circuitry 280, an impedance matching element 282, a resonant element 284, and bias circuitry 290. According to an embodiment, the oscillator sub-system 260 includes an input node 262, an output node 264, amplifier arrangement 270, and resonant circuitry 266. In addition, the oscillator sub-system 260 may include input impedance matching circuitry 268 and/or output impedance matching circuitry 269 coupled between transistor 272 and the input node 262 and/or the output node 264, respectively.

In an embodiment, oscillator sub-system 260 is a power microwave oscillator, in that the elements of the oscillator sub-system 260 are configured to produce an oscillating electrical signal at the output node 264 having a frequency in the microwave spectrum with a relatively high output power (e.g., an output power in a range of about 100 Watts (W) to about 200 W or more). Resonant circuitry 266, which is coupled along a feedback path between the output and input nodes 264, 262, completes a resonant feedback loop that causes the amplified electrical signals produced by the amplifier arrangement 270 to oscillate at or near the resonant frequency of the resonant circuitry 266. In an embodiment, the resonant circuitry 266 is configured to resonate at frequency in the microwave spectrum. According to a more particular embodiment, resonant circuitry 266 is configured to resonate at a frequency of about 2.45 GHz. Accordingly, amplified electrical signals produced by the amplifier arrangement 270 at the output node 264 oscillate at or near 2.45 GHz. It should be noted that, in practice, embodiments of the resonant circuitry 266 may be configured to resonate at different frequencies to suit the needs of the particular application utilizing the microwave system 200.

According to an embodiment, the resonant circuitry 266 includes a ring oscillator. For example, resonant circuitry 266 may include a pair of curved inductive elements that oppose one another to provide an annular structure. As used herein, an "annular structure" should be understood as referring to a ring-like structure that has a voided interior. In various embodiments, the curved inductive elements have substantially identical and complementary shapes and/or dimensions and are capacitively coupled to each other at their opposing ends. In other embodiments, oscillator sub-system 260 may implement a type of resonator other than a ring oscillator (e.g., a mechanical or piezoelectric resonator or another type of resonator).

In the illustrated embodiment of FIG. 2, the amplifier arrangement 270 is implemented as a transistor 272 having an input terminal (or control terminal) coupled to an amplifier input node 274 and an output terminal coupled to an amplifier output node 276. In the illustrated embodiment, the transistor 272 includes an N-type field effect transistor (FET) having a gate terminal connected to the amplifier input node 274, a drain terminal connected to the amplifier output node 276, and a source terminal connected to a node 278 configured to receive a ground reference voltage (e.g., about 0 Volts, although the ground reference voltage may be higher or lower than 0 Volts, in some embodiments). Although FIG. 2 illustrates the source terminal being coupled directly to ground, one or more intervening electrical components may be coupled between the source terminal and ground. In an embodiment, the transistor 272 includes a laterally diffused metal oxide semiconductor FET (LDMOSFET) transistor. However, it should be noted that the transistor 272 is not intended to be limited to any particular semiconductor technology, and in other embodiments, the transistor 272 may be realized as a gallium nitride (GaN) transistor, another type of MOSFET transistor, a bipolar junction transistor (BJT), or a transistor utilizing another semiconductor technology.

In FIG. 2, amplifier arrangement 270 is depicted to include a single transistor 272 coupled in a particular manner to other circuit components. In other embodiments, amplifier arrangement 270 may include other amplifier topologies and/or the amplifier arrangement 270 may include multiple transistors or various types of amplifiers. For example, amplifier arrangement 270 may include a single ended amplifier, a double ended amplifier, a push-pull amplifier, a Doherty amplifier, a Switch Mode Power Amplifier (SMPA), or another type of amplifier.

Frequency tuning circuitry 280 includes capacitive elements, inductive elements, and/or resistive elements that are configured to adjust the oscillating frequency of the oscillating electrical signals generated by the oscillator sub-system 260. In an exemplary embodiment, the frequency tuning circuitry 280 is coupled between the ground reference voltage node and the input node 262 of the oscillator sub-system 260.

According to an embodiment, the oscillator sub-system 260 also may include amplifier input impedance matching circuitry 268 coupled between the input node 262 of the oscillator sub-system 260 and the amplifier input 274. The impedance matching circuitry 268 is configured to match, at the resonant frequency of the resonant circuitry 266, the input impedance of the amplifier arrangement 270 (at the amplifier input node 274) to the impedance of the resonant circuitry 266 and the frequency tuning circuitry 280 (at node 262). Similarly, and according to an embodiment, the oscillator sub-system 260 may also include amplifier output impedance matching circuitry 269 coupled between the amplifier output 276 and the output node 264 configured to match, at the resonant frequency of the resonant circuitry 266, the output impedance of the amplifier arrangement 270 (at the amplifier output node 276) to the impedance of the resonant circuitry 266.

Bias circuitry 290 is coupled between the amplifier arrangement 270 and a node 254 configured to receive a positive (or supply) voltage (e.g., from power supply 230). In an embodiment, the voltage difference between the supply voltage at node 254 and the ground voltage node 278 is less than about 50 Volts. In other embodiments, the voltage difference may be more than 50 Volts. According to an embodiment, bias circuitry 290 is configured to control the direct current (DC) or nominal bias voltages at the gate and drain terminals of the transistor 272, in order to turn the transistor 272 on and to maintain the transistor 272 operating in the active mode during operation of the oscillator sub-system 260. In this regard, the bias circuitry 290 is coupled to the gate terminal of the transistor 272 of the amplifier arrangement 270 at the amplifier input node 274 and the drain terminal of the transistor 272 at the amplifier output node 276. In accordance an embodiment, bias circuitry 290 includes a temperature sensor 292 and temperature compensation circuitry 294 configured to sense or otherwise detect the temperature of the transistor 272 and to adjust the gate bias voltage at the amplifier input node 274 in response to increases and/or decreases in the temperature of the transistor 272 or the amplifier arrangement 270. In such an embodiment, bias circuitry 290 may be configured to maintain substantially constant quiescent current for the transistor 272 in response to temperature variations.

In addition, in an embodiment, bias circuitry 290 may include power detection circuitry 296. Power detection circuitry 296 is coupled between the output node 264 of the oscillator sub-system 260 and the distal end of the resonant element 284 (e.g., power detection circuitry 296 may be coupled to the output node 264, to impedance matching element 282, or to the resonant element 284, in various embodiments). Power detection circuitry 296 is configured to monitor, measure, or otherwise detect the power of the oscillating signals provided at the output node 264. In an embodiment, power detection circuitry 296 also is configured to monitor or otherwise measure the power of signal reflections from the resonant element 284. In response to detecting that the power of the signal reflections exceeds a threshold value, power detection circuitry 296 may cause bias circuitry 290 to turn off or otherwise disable amplifier arrangement 270. In this manner, power detection circuitry 296 and bias circuitry 290 are cooperatively configured to protect amplifier arrangement 270 from signal reflections in response to changes in the impedance at the resonant element 284.

Impedance matching element 282 is coupled between the output node 264 of oscillator sub-system 260 and resonant element 284, and resonant element 284 is coupled to impedance matching element 282. Impedance matching element 282 is configured to perform an impedance transformation from an impedance of the oscillator sub-system 260 (or the amplifier arrangement 270 or transistor 272) to an intermediate impedance, and resonant element 284 is configured to perform a further impedance transformation from the intermediate impedance to an impedance of heating chamber 240 (or the air cavity defined by heating chamber 240). In other words, the combination of impedance matching element 282 and resonant element 284 is configured to perform an impedance transformation from an impedance of the oscillator sub-system 260 (or the amplifier arrangement 270 or transistor 272) to an impedance of heating chamber 240 (or the air cavity defined by heating chamber 240).

Resonant element 284 is configured to radiate microwave energy into the heating chamber 240. More specifically, resonant element 284 includes one or more antennas, waveguides, and/or other hardware components configured to translate the oscillating electrical signals at the oscillator output node 264 to electromagnetic microwave signals at the resonant frequency of resonant circuitry 266. For example, in a microwave oven application where the resonant circuitry 266 is configured to produce signals at a resonant frequency of 2.45 GHz, resonant element 284 translates the oscillating electrical signals at the oscillator output node 264 to microwave electromagnetic signals at 2.45 GHz and directs the microwave signals into the heating chamber 240 of the microwave oven 200. Resonant element 284 may include, for example, a dipole antenna, a patch antenna, a microstrip antenna, a slot antenna, or another type of antenna that is suitable for radiating microwave energy. In the embodiments illustrated in FIGS. 3-5, resonant element 284 is depicted as a patch antenna. However, it is to be understood that the inventive subject matter encompasses other types of antennas, as well.

FIG. 2 illustrates a microwave oven 200 that includes multiple microwave power generation modules 250-252. As indicated previously, other embodiments of microwave ovens may include as few as one microwave power generation module, or may include more than three microwave power generation modules. When the microwave oven includes multiple microwave power generation modules, the microwave power generation modules may be identically configured (e.g., they may resonate at the same frequency, radiate microwave energy at the same power level, and so on), and may be operated simultaneously or in a defined sequence. Alternatively, the microwave power generation modules may be configured differently (e.g., they may resonate at different frequencies, and or may radiate microwave energy at different power levels). In such alternate embodiments, the microwave power generation modules may be operated simultaneously or in a defined sequence.

Figure 3:
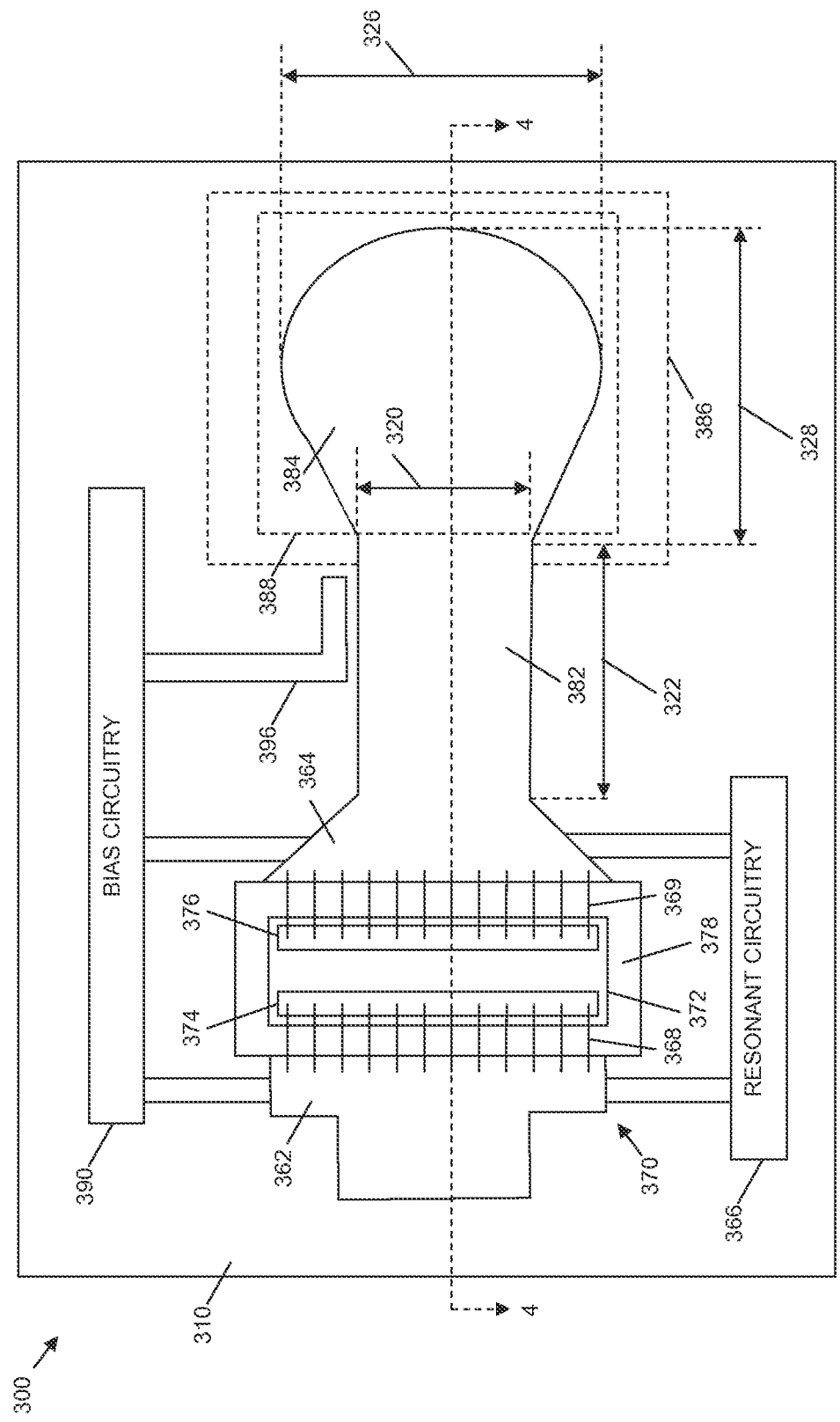
FIG. 3 is a top view of an integrated microwave power generation module, in accordance with an example embodiment.

FIGS. 3-5 illustrate various embodiments of microwave power generation modules (e.g., microwave power generation modules 250-252, FIG. 2). More specifically, FIG. 3 is a top view of an integrated microwave power generation module 300 (e.g., one of microwave power generation modules 250-252, FIG. 2), in accordance with an example embodiment, FIG. 4 is a cross-sectional, side view of the integrated microwave power generation module of FIG. 3 along lines 4-4, and FIG. 5 is a cross-sectional, side view of an integrated microwave power generation module, in accordance with another embodiment. Embodiments corresponding to FIGS. 3 and 4 will first be described, and then an alternate embodiment corresponding to FIG. 5 will be described.

Referring first to FIGS. 3 and 4, microwave power generation module 300 includes an input terminal 362, an amplifier arrangement 370 coupled to the input terminal 362, an output terminal 364 coupled to the amplifier arrangement 370, an impedance matching element 382 coupled to the output terminal 364, and a resonant element 384 coupled to the impedance matching element 382, in an embodiment. In addition, in various embodiments, microwave power generation module 300 may include bias circuitry 390, resonant circuitry 366, frequency tuning circuitry (e.g., frequency tuning circuitry 280, not shown in FIGS. 3-5), a temperature sensor (e.g., temperature sensor 294, FIG. 2, not shown in FIGS. 3-5), temperature compensation circuitry (e.g., temperature compensation circuitry 294, FIG. 2, not shown in FIGS. 3-5), and/or power detection circuitry (e.g., power detection circuitry 296, FIG. 2, not shown in FIGS. 3-5).

Some or all of the various components of microwave power generation module 300 may be coupled to a common substrate 310, in an embodiment. For example, the substrate 310 may include a microwave or RF laminate, a polytetrafluoroethylene (PTFE) substrate, a printed circuit board (PCB) material substrate (e.g., FR-4), an alumina substrate, a ceramic tile, or another type of substrate. In various alternate embodiments, various ones of the components may be coupled to different substrates with electrical interconnections between the substrates and components. In still other alternate embodiments, some or all of the components may be coupled to a chamber wall (e.g., one of chamber walls 111-115, FIG. 1) or to a portion of a door (e.g., door 116, FIG. 1), rather than being coupled to a distinct substrate. In still other alternate embodiments, some of the components may be suspended in space. For example, according to an embodiment, resonant element 384 may be suspended in space over a ground plane (e.g., ground plane 484), and air may serve as the dielectric between the resonant element 384 and the ground plane.

Input terminal 362 is configured to receive an input signal. In an embodiment, one or more conductive vias 418 though substrate 310 and conductive traces 420 on a first surface 412 of substrate may be used to supply the input signal to the input terminal 362. In an alternate embodiment, the input terminal 362 may receive the input signal from traces on the same surface 414 of the substrate 310 as the input terminal 362.

Amplifier arrangement 370 (e.g., amplifier arrangement 270, FIG. 2) is coupled between the input terminal 362 (e.g., corresponding to input node 262, FIG. 2) and the output terminal 364 (e.g., corresponding to output node 264, FIG. 2). Amplifier arrangement 370 includes one or more transistors 372 (only one of which is shown in FIGS. 3-5), and may have any of a number of amplifier configurations, as previously discussed. According to an embodiment, transistor 372 is an LDMOSFET formed on a silicon substrate. In an alternate embodiment, transistor 372 may be a different type of transistor and/or may be formed on a different type of substrate (e.g., a GaAs and/or GaN substrate). Either way, transistor 372 includes a gate contact 374 and a drain contact 376 proximate a top surface of the transistor 372, and a drain contact 474 proximate a bottom surface of the transistor 372. The gate contact 374 is electrically coupled with the input terminal 362 through a plurality of first wirebonds 368, and the drain contact 376 is electrically coupled with the output terminal 362 through a plurality of second wirebonds 369, in an embodiment. The drain terminal 474 is electrically and thermally coupled with a flange 378 or heatsink, which in turn is electrically coupled with a ground reference voltage (e.g., through node 278, FIG. 2).

According to an embodiment, as is depicted in FIG. 4, the flange 378 is coupled to a first surface 412 of the substrate 310 (i.e., a surface that is opposite a second surface 414 to which the input and output terminals 362, 364 are attached), and the substrate 310 includes an aperture or window 416 that extends between the first and second surfaces 412, 414 of substrate 310. Transistor 372 is mounted in the window 412, with its drain contact 474 affixed to the flange 378.

Input and output terminals 362, 364 are formed from conductive material that is printed on, deposited or otherwise attached to the second surface 414 of substrate 310, in an embodiment. In an alternate embodiment, transistor 372 may form a portion of a packaged device that also includes a conductive input lead, a conductive output lead, and wirebonds (e.g., functionally similar to wirebonds 368, 369) that electrically coupled the transistor 372 to the input and output leads. In such an embodiment, the input and output leads may be coupled to (e.g., soldered to) the input and output terminals.

Although the embodiment depicted in FIGS. 3 and 4 shows an amplifier arrangement 370 with a single transistor 372 coupled to a single input and output terminal 362, 364, the amplifier arrangement 370 may include multiple transistors, multiple input terminals, and/or multiple output terminals, in other embodiments. In addition, in various embodiments, microwave power generation module 300 may include input impedance matching circuitry (e.g., input impedance matching circuitry 268, FIG. 2) and/or output impedance matching circuitry (e.g., output impedance matching circuitry 269, FIG. 2) coupled between transistor 372 and the input and output terminals 362, 364, respectively. The input impedance matching circuitry and the output impedance matching circuitry each may include various inductances and capacitances, which may be implemented as discrete components (including integrated passive devices) and/or wirebonds (which function as inductances). For example, according to an embodiment, wirebonds 368, 369 each may represent series inductances that form portions of input and output impedance matching circuits, respectively. In an embodiment in which transistor 372 forms a portion of a packaged device, the input and/or output impedance matching circuitry also may be included within the packaged device. Although wirebonds 368, 369 are shown to be directly coupled between the gate and drain contacts 374, 376 and the input and output terminals 362, 364, respectively, either or both sets of wirebonds 368, 369 may be coupled through one or more intervening inductances or capacitances to the input and output terminals 362, 364.

According to an embodiment, microwave power generation module 300 also may include bias circuitry 390 (e.g., bias circuitry 290, FIG. 2) on the substrate 310, and the bias circuitry 390 is electrically coupled to the gate and drain contacts 374, 376 of transistor 372. Alternatively, bias circuitry 390 may be located on a different substrate. The voltage supplied by the bias circuitry 390 to the gate contact 374 may be in the range of about −10 Volts to about 10 Volts, in an embodiment, although the magnitude of the gate voltage may be larger, as well. In a further embodiment, the magnitude of the voltage supplied by the bias circuitry 390 to the drain contact 376 (or the DC feed) may be in a range of about +/−20 Volts to about +/−500 Volts.

According to an embodiment, the bias circuitry 390 is electrically coupled to input terminal 362 and to output terminal 364. In a particular embodiment, the bias circuit provides a single DC feed to transistor 372, and the feed point is selected so that it presents an appropriate impedance and an acceptable loading to transistor 372. In various embodiments, the feed point may be located in various locations from the output terminal 364 to the distal end of the resonant element 384 (e.g., the feed point may be at the output terminal 364, somewhere along the impedance matching element 382, or somewhere along the resonant element 384). For example, the feed point may be selected as a point that represents an RF null point, although the feed point may be selected to be at another point, as well. In still another embodiment, the DC feed may be directly coupled to the drain terminal 376.

As discussed previously in conjunction with FIG. 2, the microwave power generation module 300 may include power detection circuitry (e.g., power detection circuitry 296, FIG. 2) configured to measure signal power and/or signal reflection. The power detection circuitry may be coupled to the substrate 310 or may be coupled to a different substrate. Accordingly, microwave power generation module 300 may include a coupler 396 that is electrically coupled to the power detection circuitry and is proximate to either the output terminal 264, the impedance matching element 382 (as illustrated), or the resonant element 384, in various embodiments.

As also discussed previously in conjunction with FIG. 2, the microwave power generation module 300 may include one or more temperature sensors and temperature compensation circuitry (e.g., temperature sensor 292 and temperature compensation circuitry 294, FIG. 2) configured to sense or otherwise detect the temperature of the transistor 372 and to adjust the gate bias voltage at the gate terminal 374 in response to increases and/or decreases in the temperature of the transistor 372 or the amplifier arrangement 370. The temperature sensor(s) and temperature compensation circuitry may be coupled to the substrate 310 or may be coupled to a different substrate.

Further, microwave power generation module 300 includes resonant circuitry 366 (e.g., resonant circuitry 266, FIG. 2) on the substrate 310. Alternatively, resonant circuitry 366 may be located on a different substrate. Resonant circuitry 366 is coupled along a feedback path between the output and input terminals 364, 362. As discussed previously, resonant circuitry 366 causes the amplified electrical signals produced by the amplifier arrangement 370 to oscillate at or near the resonant frequency of the resonant circuitry 366 (e.g., at a frequency of about 2.45 GHz, or some other frequency). According to an embodiment, the resonant circuitry 366 may include a ring oscillator. In other embodiments, resonant circuitry 366 may include a type of resonator other than a ring oscillator (e.g., a mechanical or piezoelectric resonator or another type of resonator).

Microwave power generation module further includes impedance matching element 382 (e.g., impedance matching element 282, FIG. 2) having a proximal end coupled to the output terminal 364 of the transistor arrangement 370, and a distal end coupled to the resonant element 384. Impedance matching element 382 is formed from a conductive material (e.g., copper or another material) that is printed on or otherwise deposited on or affixed to the surface of substrate 310. According to an embodiment, impedance matching element 382 is a planar conductive structure configured to perform a non-negligible impedance transformation.

More specifically, impedance matching element 382 is configured to perform an impedance transformation from an impedance of the amplifier arrangement 370 (or transistor 372) to an intermediate impedance.

Impedance matching element 382 may be substantially rectangular, as illustrated in FIG. 3, or may have another shape. In an embodiment in which impedance matching element 382 is substantially rectangular, impedance matching element 382 may have a width 320, length 322, and thickness 422 that result in the desired impedance transformation. For example, impedance matching element 382 has a width 320 in a range of about 0.5 centimeters (cm) to about 3.0 cm, a length 322 in a range of about 1.3 cm to about 7.6 cm, and a thickness 422 in a range of about 0.001 cm to about 0.25 cm. In other embodiments, the width, length, and/or thickness of impedance matching element 382 may have values outside of these ranges.

Microwave power generation module further includes resonant element 384 (e.g., resonant element 284, FIG. 2) having a proximal end coupled to the distal end of impedance matching element 382. Resonant element 384 also is formed from a conductive material (e.g., copper or another material) that is printed on or otherwise deposited on or affixed to the surface of substrate 310, in an embodiment. According to an embodiment, resonant element 384 also is a planar conductive structure. According to an embodiment, impedance matching element 382 and resonant element 384 may be integrally formed (e.g., from a single layer of conductive material). In addition, output terminal 364 may be integrally formed with the impedance matching element 382 and the resonant element 384. In an alternate embodiment, impedance matching element 382 and resonant element 384 may not be integrally formed and/or may comprise different conductive materials. For example, in an alternate embodiment, resonant element 384 may include a brass plate (or a plate of other conductive material) that is either affixed to substrate 310 or that extends beyond substrate 310 and is suspended in the air.

Resonant element 384 is configured to perform a further impedance transformation from the intermediate impedance to an impedance of a heating chamber 440 (e.g., heating chamber 240). For example, resonant element 384 may perform an impedance transformation from the intermediate impedance to an impedance in the range of about 100 Ohms to about 400 Ohms. In other embodiments, resonant element 384 may perform an impedance transformation between the intermediate impedance and an air cavity impedance outside of this range.

Resonant element 384 may be substantially elliptical, as illustrated in FIG. 3, or may have another shape (e.g., square, rectangular, circular, or another substantially continuous shape). In an embodiment in which resonant element 384 is substantially elliptical, resonant element 384 has a major axis 326, minor axis 328, and thickness 422 that result in efficient resonance of the microwave signal into the heating chamber 440. For example, resonant element 384 may have a major axis 326 in a range of about 2.54 cm to about 25.4 cm, a minor axis 328 in a range of about 1.3 cm to about 7.6 cm, and a thickness 422 in a range of about 0.001 cm to about 0.25 cm. In other embodiments, the major axis, minor axis, and/or thickness of resonant element 384 may have values outside of these ranges.

Referring to FIG. 4, microwave power generation module 300 may be affixed to a chamber wall 430 (e.g., one of chamber walls 111-115, FIG. 1) that partially defines a heating chamber 440. Chamber wall 430 is formed from a dielectric material (e.g., fiberglass, PTFE, or another material), in an embodiment. For example, in the embodiment illustrated in FIG. 4, microwave power generation module 300 is affixed to an exterior surface of chamber wall 430 (i.e., a surface opposite the surface that defines the heating chamber 440) using connectors 434. Chamber wall 430 includes an opening 388 (shown using a dashed box in FIG. 3), in an embodiment, and the resonant element 384 is substantially aligned with the opening 388. A cover 432 may be affixed to the chamber wall 430 in order to cover the opening 388 and protect the microwave power generation module 300. The cover 432 is formed from a material that will not substantially attenuate the microwave energy 450 being radiated by the resonant element 384. In an alternate embodiment, microwave power generation module 300 may be affixed to a door of the microwave oven (e.g., door 116, FIG. 1), rather than to a chamber wall.

As discussed previously, resonant element 384 is configured to radiate, into the heating chamber 440, microwave energy 450 at the resonant frequency of resonant circuitry 366 (e.g., about 2.45 GHz, or some other frequency). In the embodiments depicted in FIGS. 3 and 4, resonant element 384 is configured as a patch antenna. The patch antenna further may include a ground plane 386 (the boundaries of which are shown using dashed lines in FIG. 3). The ground plane 386 is separated from the radiating portion of the resonant element 384 by a dielectric (e.g., the portion of substrate 310 between resonant element 384 and ground plane 386, although an air dielectric also may be implemented). According to an embodiment, the ground plane 386 functions to substantially block radiation from the resonant element 384 from emanating beyond the ground plane 386. Impedance matching element 382 may be configured so that it does not resonate a significant amount of microwave energy. Thus, the ground plane 386 may not necessarily extend underneath impedance matching element 382.

Microwave power generation module 300 is attached to the chamber wall 430 so that the maximum gain of the radiation pattern 450 (or the 3 dB beam width) extends in a direction toward the heating chamber 440 and through the opening 388 in the chamber wall 430. In alternate embodiments, resonant element 384 may be embodied as a dipole antenna, a slot antenna, or another type of antenna that is suitable for radiating microwave energy.

In other embodiments, a microwave power generation module may be attached to a chamber wall in a different manner from that illustrated in FIG. 4. For example, FIG. 5 is a cross-sectional, side view of an integrated microwave power generation module 500 attached to a chamber wall 530, in accordance with another example embodiment. The microwave power generation module 500 of FIG. 5 is similar to the microwave power generation module 300 of FIGS. 3 and 4, in that microwave power generation module 500 includes an input terminal 562, an amplifier arrangement 570 coupled to the input terminal 562, an output terminal 564 coupled to the amplifier arrangement 570, an impedance matching element 582 coupled to the output terminal 564, and a resonant element 584 coupled to the impedance matching element 582, in an embodiment. In addition, in various embodiments, microwave power generation module 500 may include bias circuitry (e.g., bias circuitry 290, 390, FIGS. 2, 3), resonant circuitry (e.g., resonant circuitry 266, 366, FIGS. 2, 3), frequency tuning circuitry (e.g., frequency tuning circuitry 280, FIG. 2), a temperature sensor (e.g., temperature sensor 294, FIG. 2), temperature compensation circuitry (e.g., temperature compensation circuitry 294, FIG. 2), and/or power detection circuitry (e.g., power detection circuitry 296, FIG. 2). In addition, some or all of the various components of microwave power generation module 300 may be coupled to a common substrate 510.

Amplifier arrangement 570 includes one or more transistors 572 (only one of which is shown in FIG. 5), and may have any of a number of amplifier configurations, as previously discussed. Transistor 572 includes a gate contact 574 and a drain contact 576 proximate a top surface of the transistor 572, and a drain contact 574 proximate a bottom surface of the transistor 572. The gate contact 574 is electrically coupled with the input terminal 562 through a plurality of first wirebonds 568, and the drain contact 576 is electrically coupled with the output terminal 562 through a plurality of second wirebonds 569, in an embodiment. The drain terminal 574 is electrically and thermally coupled with a flange 578 or heatsink, which in turn is electrically coupled with a ground reference voltage (e.g., through node 278, FIG. 2).

In contrast with the embodiment depicted in FIG. 3, flange 578 is press-fit or otherwise inserted in an opening in the substrate 510, so that the flange 578 is exposed at both a first and second surface 512, 514 of the substrate 510. In the embodiment illustrated in FIG. 5, transistor 572 is mounted on the side of flange 578 that is exposed at the second surface 514, which is the same surface of the substrate 510 to which the input and output terminals 562, 564 are attached. In the embodiment of FIG. 3, flange 378 may be press-fit into substrate 310 in a similar manner. Correspondingly, in the embodiment of FIG. 5, flange 578 may be coupled to a surface of the substrate 510 opposite the side to which the input and output terminals 562, 564 are attached.

In addition, in contrast with the embodiment depicted in FIG. 3, microwave power generation module 500 includes a dielectric structure 522 interposed between resonant element 584 and a ground plane 586. In other words, the ground plane 586 is separated from the radiating portion of the resonant element 584 by dielectric structure 522, although an air dielectric also may be implemented. According to an embodiment, the ground plane 586 functions to substantially block radiation from the resonant element 584 from emanating beyond the ground plane 586.

Microwave power generation module 500 is attached to the chamber wall 530 so that the maximum gain coupling extends through the substrate 510 and through the opening 588 in the chamber wall 530 toward heating chamber 540. As with the embodiment of FIG. 4, a cover 532 may be affixed to the chamber wall 530 in order to cover the opening 588 and protect the microwave power generation module 500. In an alternate embodiment, microwave power generation module 500 may be affixed to a door of the microwave oven (e.g., door 116, FIG. 1), rather than to a chamber wall.

Figure 6:
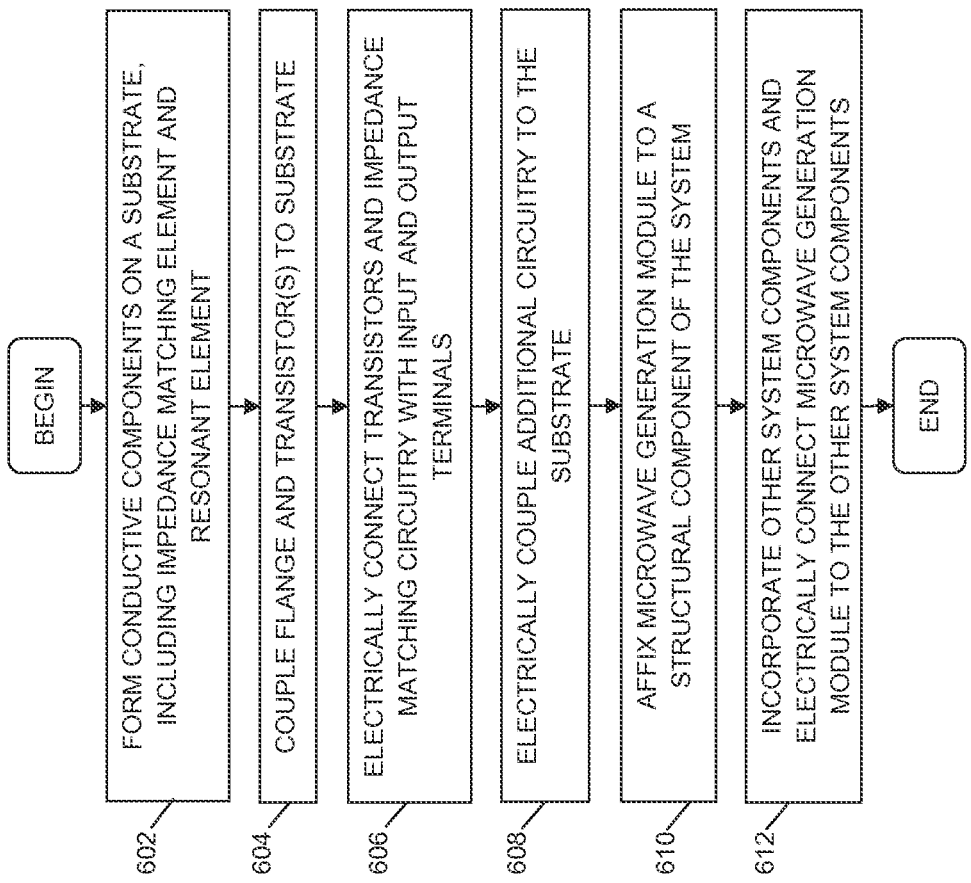
FIG. 6 is a flowchart of a method of manufacturing a microwave system that includes an integrated microwave power generation module, in accordance with an example embodiment.

FIG. 6 is a flowchart of a method of manufacturing a microwave system (e.g., microwave oven 100, FIG. 1, or another system) that includes an integrated microwave power generation module (e.g., microwave power generation module 250-252, 300, 500, FIGS. 2-5), in accordance with an example embodiment. The method may begin, in block 602, by forming various conductive components on a substrate (e.g., substrate 310, 510, FIGS. 3-5). For example, the conductive components may include an input terminal (e.g., input terminal 362, 562, FIGS. 3-5), an output terminal (e.g., output terminal 364, 564, FIGS. 3-5), an impedance matching element (e.g., impedance matching element 282, 382, 582, FIGS. 2-5), and a resonant element (e.g., resonant element 284, 384, 584, FIGS. 2-5). In addition, formation of the conductive components may include forming a ground plane (e.g., ground plane 386, 586, FIGS. 3-5) underlying the resonant element, in an embodiment in which the microwave power generation module includes a patch antenna. In an alternate embodiment, the resonant element may be attached to the substrate, rather than being formed on the substrate (e.g., the resonant element may be attached to the substrate and suspended in space). Additional conductors configured to electrically connect with other circuitry (e.g., bias circuitry, frequency tuning circuitry, and resonant circuitry) also may be formed on and/or in the substrate.

In block 604, a flange (or heatsink) (e.g., flange 378, 578, FIGS. 3-5) may be coupled to the substrate, and one or more transistors (e.g., transistors 272, 372, 572, FIGS. 2-5) are coupled to the flange. In block 606, the transistor(s) may then be electrically connected with the input and output terminals. For example, the gate terminal of each transistor may be electrically coupled to the input terminal using first wirebonds (e.g., wirebonds 368, 568, FIGS. 3-5), and the drain terminal of each transistor may be coupled to the output terminal using second wirebonds (e.g., wirebonds 369, 569, FIGS. 3-5). One or more components associated with input impedance matching circuitry (e.g., input impedance matching circuitry 268, FIG. 2) and/or output impedance matching circuitry (e.g., output impedance matching circuitry 269, FIG. 2) also may be coupled to the flange and/or substrate, and these components may be electrically coupled between the transistor and the input and output terminals, respectively.

In block 608, additional circuitry may be electrically coupled to the substrate and/or to one or more other substrates. In various embodiments, the additional circuitry may include any combination of frequency tuning circuitry (e.g., frequency tuning circuitry 280, FIG. 2), resonant circuitry (e.g., resonant circuitry 266, 366, FIGS. 2, 3), bias circuitry (e.g., bias circuitry 290, 390, FIGS. 2, 3), temperature sensor(s) (e.g., temperature sensor 292, FIG. 2), temperature compensation circuitry (e.g., temperature compensation circuitry 294, FIG. 2), and/or power detection circuitry (e.g., power detection circuitry 296, FIG. 2). In other embodiments, some or all of the additional circuitry may be coupled to other substrates.

In block 610, the microwave power generation module (including at least a substrate, transistor(s), impedance matching element, and resonant element) may be physically coupled to structural components of the microwave system. For example, in a microwave oven embodiment, the resonant element may be aligned with an opening (e.g., opening 388, 588, FIGS. 3-5) in a chamber wall (e.g., one of chamber walls 111-115, 430, 530, FIGS. 1, 4, and 5), and the substrate may be affixed to the chamber wall. Alternatively, the substrate may be affixed to a structural component other than the chamber wall (e.g., to door 116, FIG. 1, or some other structural component), as long as the resonant element is held in a position in which it is aligned with the opening in the chamber wall. In still other embodiments, some or all of the components associated with the microwave power generation module may be directly coupled to the chamber wall (e.g., rather than being coupled to substrate 310, 510, FIGS. 3-5).

In block 612, additional components of the microwave system may be incorporated into the system (e.g., user interface 220, system controller 210, power supply 230, other microwave power generation modules, and so on). The microwave power generation module may then be electrically coupled with some of the additional components. For example, the bias circuitry may be electrically coupled with a power supply (e.g., power supply 230, FIG. 2) and/or with a system controller (e.g., system controller 210, FIG. 2). Once fully assembled, the microwave system may be ready for operation.

It should be understood that the order of operations associated with the blocks depicted in FIG. 6 corresponds to an example embodiment, and should not be construed to limit the sequence of operations only to the illustrated order. Instead, some operations may be performed in different orders, and/or some operations may be performed in parallel.

For the sake of brevity, conventional techniques related to resonators, amplifiers, biasing, load modulation, impedance matching, power splitters and/or power combiners, microwave applications, and other functional aspects of the systems (and the individual operating components of the systems) may not be described in detail herein. The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

An embodiment of a microwave power generation module includes an amplifier arrangement, an impedance matching element, and a resonant element. The amplifier arrangement includes a transistor with a transistor input and a transistor output. The impedance matching element is formed from a planar conductive structure. The planar conductive structure has a proximal end and a distal end, and the proximal end is electrically coupled to the transistor output. The resonant element has a proximal end electrically coupled to the distal end of the planar conductive structure, and the resonant element is configured to radiate electromagnetic energy having a microwave frequency in a range of 800 MHz to 300 GHz. A combination of the impedance matching element and the resonant element is configured to perform an impedance transformation between an impedance of the transistor and an impedance of an air cavity.

An embodiment of a microwave system includes a structural component and a microwave power generation module coupled to the structural component. The microwave power generation module includes an amplifier arrangement, an impedance matching element, and a resonant element. The amplifier arrangement includes a transistor with a transistor input and a transistor output. The impedance matching element is formed from a planar conductive structure. The planar conductive structure has a proximal end and a distal end, and the proximal end is electrically coupled to the transistor output. The resonant element has a proximal end electrically coupled to the distal end of the planar conductive structure, and the resonant element is configured to radiate electromagnetic energy having a microwave frequency in a range of 800 MHz to 300 GHz. A combination of the impedance matching element and the resonant element is configured to perform an impedance transformation between an impedance of the transistor and an impedance of an air cavity.

An embodiment of a method for forming a microwave system includes forming a microwave power generation module by forming an impedance matching element from a planar conductive structure, which has a proximal end and a distal end. The method continues by electrically coupling the proximal end of the impedance matching element to a transistor that includes a transistor input and a transistor output, and electrically coupling a proximal end of a resonant element to the distal end of the impedance matching element. The resonant element is configured to radiate electromagnetic energy having a microwave frequency in a range of 800 MHz to 300 GHz. A combination of the impedance matching element and the resonant element is configured to perform an impedance transformation between an impedance of the transistor and an impedance of an air cavity.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A microwave power generation module comprising:
a substrate having a first surface;
an amplifier arrangement that includes a transistor with a transistor input and a transistor output;
an impedance matching element formed from a first planar conductive structure that is coupled to the first surface of the substrate, wherein the first planar conductive structure has a proximal end and a distal end, and wherein the proximal end is electrically coupled to the transistor output; and
a resonant element coupled directly to the first surface of the substrate, wherein the resonant element has a proximal end electrically coupled to the distal end of the first planar conductive structure, the resonant element is configured to radiate electromagnetic energy having a microwave frequency in a range of 800 megahertz (MHz) to 300 gigahertz (GHz), and the resonant element forms at least a portion of a patch antenna, and
wherein a combination of the impedance matching element and the resonant element is configured to perform a first impedance transformation between an impedance of the transistor and an impedance of an air cavity, and
wherein the transistor includes a gate contact that functions as the transistor input, a source contact, and a drain contact that functions as the transistor output, and wherein the microwave power generation module further comprises a plurality of wirebonds electrically coupled between the drain contact and the proximal end of the first planar conductive structure, an input terminal, and the plurality of wirebonds coupled between the input terminal and the gate contact,
wherein an output impedance matching network electrically coupled directly to the drain contact of the transistor such that the output impedance matching network is located between the drain contact and the proximal end of the first planar conductive structure, wherein the plurality of wirebonds forms a portion of the output impedance matching network, and wherein the output impedance matching network is configured to perform a second impedance transformation between an impedance of the transistor at the transistor output and an impedance of the impedance matching element, and
wherein an input impedance matching network electrically coupled directly to the gate contact of the transistor such that the input impedance matching network is located between the input terminal and the gate contact, wherein the plurality of wirebonds forms a portion of the input impedance matching network, and wherein the input impedance matching network is configured to perform a third impedance transformation between an impedance of additional circuitry coupled to the input terminal and an impedance of the transistor at the gate contact.

2. A microwave power generation module comprising:
a substrate having a first surface and a dielectric;
an amplifier arrangement that includes a transistor with a transistor input and a transistor output;
an impedance matching element formed from a first planar conductive structure that is coupled to the first surface of the substrate, wherein the first planar conductive structure has a proximal end and a distal end, and wherein the proximal end is electrically coupled to the transistor output; and
a resonant element coupled directly to the first surface of the substrate, wherein the resonant element has a proximal end electrically coupled to the distal end of the first planar conductive structure, and the resonant element is configured to radiate electromagnetic, energy having a microwave frequency in a range of 800 megahertz (MHz) to 300 gigahertz (GHz), wherein the resonant element forms a portion of a patch antenna that also includes a ground plane that is separated from the resonant element by the dielectric of the substrate, and
wherein a combination of the impedance matching element and the resonant element is configured to perform a first impedance transformation between an impedance of the transistor and an impedance of an air cavity, and
wherein the transistor includes a gate contact that functions as the transistor input, a source contact, and a drain contact that functions as the transistor output, and wherein the microwave power generation module further comprises a plurality of wirebonds electrically coupled between the drain contact and the proximal end of the first planar conductive structure, an input terminal, and the plurality of wirebonds coupled between the input terminal and the gate contact,
wherein an output impedance matching network electrically coupled directly to the drain contact of the transistor such that the output impedance matching network is located between the drain contact and the proximal end of the first planar conductive structure, wherein the plurality of wirebonds forms a portion of the output impedance matching network, and wherein the output impedance matching network is configured to perform a second impedance transformation between an impedance of the transistor at the transistor output and an impedance of the impedance matching element, and
wherein an input impedance matching network electrically coupled directly to the gate contact of the transistor such that the input impedance matching network is located between the input terminal and the gate contact, wherein the plurality of wirebonds forms a portion of the input impedance matching network, and wherein the input impedance matching network is configured to perform a third impedance transformation between an impedance of additional circuitry coupled to the input terminal and an impedance of the transistor at the gate contact.

3. The microwave power generation module of claim 1, wherein the impedance matching element and the resonant element are integrally formed portions of a conductive layer formed on the first surface of the substrate.

4. A microwave power generation module comprising:
a substrate having a first surface;
an oscillator sub-system that includes
an amplifier arrangement that includes a transistor with a transistor input and a transistor output, and
resonant circuitry along a feedback path between the transistor output and the transistor input, wherein a resonant frequency of the resonant circuitry is about 2.45 gigahertz (GHz),
an input impedance matching network,
an output impedance matching network;
an impedance matching element formed from a first planar conductive structure coupled to the first surface of the substrate, wherein the first planar conductive structure has a proximal end and a distal end, and wherein the proximal end is electrically coupled to the transistor output; and
a resonant element coupled directly to the first surface of the substrate, wherein the resonant element has a proximal end electrically coupled to the distal end of the first planar conductive structure, and the resonant element is configured to radiate electromagnetic energy having the microwave frequency, and
wherein a combination of the impedance matching element and the resonant element is configured to perform a first impedance transformation between an impedance of the transistor and an impedance of an air cavity, and
wherein the transistor includes a gate contact that functions as the transistor input, a source contact, and a drain contact that functions as the transistor output, and wherein the microwave power generation module further comprises a plurality of wirebonds electrically coupled between the drain contact and the proximal end of the first planar conductive structure, an input terminal, and the plurality of wirebonds coupled between the input terminal and the gate contact,
wherein the output impedance matching network electrically coupled directly to the drain contact of the transistor such that the output impedance matching network is located between the drain contact and the proximal end of the first planar conductive structure, wherein the plurality of wirebonds forms a portion of the output impedance matching network, and wherein the output impedance matching network is configured to perform a second impedance transformation between an impedance of the transistor at the transistor output and an impedance of the impedance matching element, and
wherein the input impedance matching network electrically coupled directly to the gate contact of the transistor such that the input impedance matching network is located between the input terminal and the gate contact, wherein the plurality of wirebonds forms a portion of the input impedance matching network, and wherein the input impedance matching network is configured to perform a third impedance transformation between an impedance of additional circuitry coupled to the input terminal and an impedance of the transistor at the gate contact.

5. The microwave power generation module of claim 1, further comprising:
bias circuitry coupled to an RF null point located between the transistor output and a distal end of the resonant element.

6. A microwave system comprising:
a structural component; and
a microwave power generation module coupled to the structural component, wherein the microwave power generation module includes
a substrate having a first surface and a dielectric;
an amplifier arrangement that includes a transistor with a transistor input and a transistor output,
an impedance matching element formed from a first planar conductive structure coupled to the first surface of the substrate, wherein the first planar conductive structure has a proximal end and a distal end, and wherein the proximal end is electrically coupled to the transistor output, and
a resonant element coupled directly to the first surface of the substrate, wherein the resonant element has a proximal end electrically coupled to the distal end of the first planar conductive structure, the resonant element is configured to radiate electromagnetic energy having a microwave frequency in a range of 800 megahertz (MHz) to 300 gigahertz (GHz), and the resonant element forms at east a portion of a patch antenna, and
wherein a combination of the impedance matching element and the resonant element is configured to perform a first impedance transformation between an impedance of the transistor and an impedance of an air cavity, and
wherein the transistor includes a gate contact that functions as the transistor input, a source contact, and a drain contact that functions as the transistor output, and wherein the microwave power generation module further comprises a plurality of wirebonds electrically coupled between the drain contact and the proximal end of the first planar conductive structure, an input terminal, and the plurality of wirebonds coupled between the input terminal and the gate contact,
wherein an output impedance matching network electrically coupled directly to the drain contact of the transistor such that the output impedance matching network is located between the drain contact and the proximal end of the first planar conductive structure, wherein the plurality of wirebonds forms a portion of the output impedance matching network, and wherein the output impedance matching network is configured to perform a second impedance transformation between an impedance of the transistor at the transistor output and an impedance of the impedance matching element, and
wherein an input impedance matching network electrically coupled directly to the gate contact of the transistor such that the input impedance matching network is located between the input terminal and the gate contact, wherein the plurality of wirebonds forms a portion of the input impedance matching network, and wherein the input impedance matching network is configured to perform a third impedance transformation between an impedance of additional circuitry coupled to the input terminal and an impedance of the transistor at the gate contact.

7. The microwave system of claim 6, wherein the microwave system is a microwave oven, and the microwave system further comprises:

a heating chamber at least partially defined by one or more chamber walls, wherein a chamber wall of the one or more chamber walls includes an opening, and wherein the resonant element is substantially aligned with the opening so that, during operation of the microwave oven, a substantial portion of the energy radiated by the resonant element passes through the opening into the heating chamber.

8. The microwave system of claim 6, wherein the microwave power generation module further comprises:

bias circuitry configured to provide a bias voltage to the transistor; and a power supply electrically coupled to the bias circuitry and configured to selectively provide a source voltage to the bias circuitry.

9. The microwave system of claim 8, further comprising:

a temperature sensor configured to detect a temperature of a portion of the microwave power generation module; and temperature compensation circuitry configured to adjust the bias voltage based on the temperature.

10. The microwave oven of claim 8, further comprising:

power detection circuitry configured to detect signal power, signal reflections, or both, and to adjust the operation of the bias circuitry according to the detected signal power, signal reflections, or both.

11. The microwave system of claim 6, further comprising:

resonant circuitry along a feedback path between the transistor output and the transistor input, wherein a resonant frequency of the resonant circuitry is the microwave frequency.

* * * * *